United States Patent [19]

Swanson et al.

[11] 4,246,554

[45] Jan. 20, 1981

[54] INDUCTORLESS MONOLITHIC CRYSTAL FILTER NETWORK

[75] Inventors: Thomas W. Swanson, North Redington Beach; Paul A. Herzig, St. Petersburg, both of Fla.

[73] Assignee: E-Systems, Inc., Dallas, Tex.

[21] Appl. No.: 968,302

[22] Filed: Dec. 11, 1978

[51] Int. Cl.³ .................. H03H 9/50; H03H 9/52; H03H 9/56; H03H 9/60

[52] U.S. Cl. .................................. 333/192; 333/189; 333/191

[58] Field of Search .............................. 333/186–192; 310/311, 312, 314–325, 328–333, 365–366; 29/25.35

[56] References Cited

U.S. PATENT DOCUMENTS

| | | | |
|---|---|---|---|
| 3,287,669 | 11/1966 | Poschenrieder | 333/186 |
| 3,401,275 | 9/1968 | Curran et al. | 333/189 X |
| 3,437,848 | 4/1969 | Borner et al. | 333/187 X |
| 3,564,463 | 2/1971 | Beaver et al. | 333/191 |
| 3,569,212 | 7/1971 | Werner et al. | 333/191 |
| 3,585,537 | 6/1971 | Rennick | 333/191 |
| 3,613,031 | 10/1971 | Pond | 333/189 |
| 3,624,564 | 11/1971 | Ise et al. | 333/192 X |
| 3,676,806 | 7/1972 | Orchard et al. | 333/187 |
| 3,686,593 | 8/1972 | Zakaria | 333/200 |
| 3,704,443 | 11/1972 | Garrison et al. | 333/192 |
| 3,716,808 | 2/1973 | Malinowski et al. | 333/192 |
| 3,916,490 | 11/1975 | Shean et al. | 333/189 X |
| 3,944,951 | 3/1976 | Kurth | 333/192 |
| 3,947,784 | 3/1976 | Arvanitis et al. | 333/191 |
| 3,986,151 | 10/1976 | Kawazawa et al. | 333/197 |
| 4,013,982 | 3/1977 | Wood et al. | 333/192 |
| 4,028,647 | 6/1977 | Yee | 333/192 |

OTHER PUBLICATIONS

Dillon et al.–"Cascade Synthesis of Polylithic Crystal Filters Containing Double Resonator Monolithic Crystal Filter (MCF) Elements" in IEEE Trans. on Circuits and Systems, vol. Cas 23, No. 3, Mar. 1976; pp. 146-154.
Herzig et al.–"A Polylithic Crystal Filter Employing a Rhodes Transfer Function", Published in the Proc. of the 32nd Annual Symposium on Frequency Control.
Herzig et al.–"A Polylithic Crystal Filter for Satellite Channel Applications" published in the 1978 IEEE International Symposium on Circuits and Systems.

Primary Examiner—Marvin L. Nussbaum
Attorney, Agent, or Firm—Albert M. Crowder, Jr.

[57] ABSTRACT

A two-pole inductorless monolithic crystal filter device comprising first and second spaced electrodes mounted on one face of the device, third and fourth spaced electrodes mounted on the opposite face of the device in superimposed relationship with the first and second electrodes, a first capacitor coupled between the first and fourth electrodes, means electrically coupling the second and third electrodes, and a second capacitor coupling the second and third electrodes to a point of reference potential with the first electrode and point of reference potential being designated as input terminals and the fourth electrode and point of reference potential being designated as output terminals.

19 Claims, 16 Drawing Figures

INITIAL BANDPASS NETWORK

FINAL TRANSFORMED BANDPASS NETWORK

INDUCTORLESS MONOLITHIC CRYSTAL FILTER NETWORK

BACKGROUND OF THE INVENTION

This invention relates to bandpass filter networks and particularly to networks of this type that include double-resonator monolithic crystal filter sections or elements. Monolithic piezoelectric filters are crystal elements which, with their attached resonators, serve as filters without additional components and are old and well-known in the art as illustrated in U.S. Pat. No. 3,564,463 to Beaver et al issued Feb. 16, 1971. As stated therein, in order to avoid complex filters resulting from duplication of crystal structures and extra components, attempts have been made to combine the characteristics of two crystal resonators acoustically by mounting two sets of electrodes on a single body. Thus, the characteristics of the crystal structure were controlled such that the structure alone, monolithically, was capable of performing many of the functions previously performed by whole networks incorporating such crystal structures. Further, practical polylithic filter devices, that is, filters utilizing a plurality of monolithic crystals, have been disclosed as, for example, in U.S. Pat. No. 3,676,806 issued July 11, 1972.

A new class of filter function of the nonminimum phase type was developed by J. D. Rhodes as disclosed in a paper entitled "A Low Pass Prototype Network for Microwave Linear Phase Filters," *IEEE Transactions on Microwave Theory and Techniques,* MTT-18, Pages 290–301 (June 1970). This filter function offers optimized amplitude and phase responses with functions of lower order and without the use of additional equalizers. However, the Rhodes filter, while offering excellent theoretical performance, has not been realizable for practical applications due to problems with the impedance inverters and monolithic bridging elements caused by inefficient energy storage or figure of merit, Q, of practical inductors. For example, severe degradation of performance is caused by the Q's associated with actual components.

SUMMARY OF THE INVENTION

The present invention relates to a Rhodes-type filter wherein a unique transformation is used to eliminate problems associated with bridging and inverter inductors. In a Rhodes-type filter of typical design, computer analysis demonstrates that element Q's for the bridging and inverter inductors of greater than 200 are needed in order to realize acceptable performance. Due to size and weight constraints, it is impractical to provide inductors of this magnitude. Also, the self-resonance of the inductors would be on the order of 8–12 Mhz which is unacceptably low.

The problems associated with these inductors are overcome by the present invention through the use of a unique transformation to eliminate the offending elements. Basically, the filter of the present invention is accomplished by incorporating the external inverters into the monolithic crystal resonator and by changing the bridging inductors to capacitors.

The present invention relates to a two-pole inductorless monolithic crystal filter device comprising first and second spaced electrodes mounted on one face of the device, third and fourth spaced electrodes positioned on the opposite face of the device in superimposed relationship with the first and second electrodes, a first capacitor coupled between the first and fourth electrodes, means electrically coupling the second and third electrodes, and a second capcitor coupling the second and third electrodes to a point of reference potential, the first electrode and point of reference potential being designated as input terminals and the fourth electrode and point of reference potential being designated as output terminals.

The present invention further envisions a method of transforming a ladder-form, Rhodes-type, bandpass filter network utilizing a plurality of monolithic crystal filter elements to form a polylithic inductorless bandpass network comprising the steps of impedance scaling each monolithic in the Rhodes-type network so that all inverters have substantially the same component values, converting the ladder form of the monolithics into an equivalent lattice, transforming the lattice to an equivalent bridged-T network wherein the monolithic bridging inductors become capcitors and the sign of all components in each inverter is changed, and absorbing the changed inverters into the monolithic whereby an inductorless polylithic bandpass filter is obtained.

BRIEF DESCRIPTION OF THE DRAWINGS

These and other objects of the instant invention may be had by referring to the following specification and drawings in which like numerals indicate like components and in which.

DESCRIPTION OF THE PREFERRED EMBODIMENT

Figure 2:
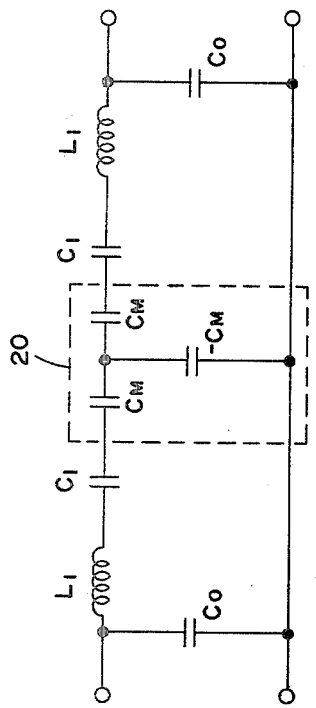
FIG. 2 is the equivalent bandpass ladder circuit of the double-resonator monolithic crystal filter element or unit illustrated in FIG. 1.

It is old and well-known to use quartz crystal resonators as filters. There are many different types of these filters using piezoelectric devices in which two or more pairs of electrodes are deposited on the same quartz plate on one or both sides thereof. By application of a potential difference across the electrodes, the quartz is excited into a mechanical mode of resonance.

The monolithic crystal filter is especially useful in filter applications because of its low cost, small size and weight. Further, since it is passive it requires no power and provides highly selective filtering functions. Double resonators or split electrode filters employ a first or input pair of electrodes mounted on opposite faces of a crystal wafer to form a primary or input resonator. A secondary resonator is formed by two additional electrodes which are spaced from the first set of electrodes and mounted on opposite faces of the same crystal wafer. Depending upon the manner in which these electrodes are interconnected and the discrete reactive circuit elements which externally interconnect various ones of the electrodes, different types of filters having various characteristics are obtained. Some of the filters are restricted to bandpass characteristics while others provide band elimination.

It is the usual practice in bandpass filter design, in order to reduce complexity, to specify a lowpass transfer function which satisfies desired values and synthesize a nonphysical lowpass prototype network from the transfer function. This network may then be transformed to a physically realizable bandpass network containing crystal elements by a suitable lowpass to bandpass transformation which is well-known in the art.

U.S. Pat. No. 4,028,647 issued June 7, 1977, to Henry Yee, discloses a two-pole monolithic bandpass filter configuration with finite attenuation poles or transmission zeros lying on the imaginary axis. These sections are mathematical transformations of classical Brune sections and can realize only a minimum phase filter configuration. This means that in order to achieve delay equalization, it is necessary to add a delay equalizer to the network.

The nonminimum phase-type filter developed by J.D. Rhodes, discussed above, as described in the paper entitled, "A Low Pass Prototype Network for Microwave Linear Phase Filters," *IEEE Transactions on Microwave Theory and Techniques*, MTT-18, Pages 290–301 (June 1970) offers optimized amplitude and phase responses with functions of lower order and without the use of additional equalizers. Although the theoretical results are outstanding, practical models for particular applications such as use with satellites are not realizable due to severe degradation of performance caused by Q's associated with actual components.

The design requirements shown in Table I are representative of those for a 25 KHz data channel in a typical satellite which cannot be satisfied with a practical model of the Rhodes-type filter.

TABLE I

| | |
|---|---|
| CENTER FREQUENCY | 23 MHz |
| 0.5 db BW | 24.5 KHz ± 1 KHz |
| 10 db BW | 35 KHz MAX. |
| 30 db BW | 55 KHz MAX. |
| PASSBAND RIPPLE | 0.15 db over fc ± 10 KHz |
| PHASE LINEARITY | ± 5.0° over fc ± 10 KHz |

TABLE I-continued

| | |
|---|---|
| INSERTION LOSS | 2.5 db MAX. |

The problems caused by actual component Q's can be overcome, however, by using an appropriate transformation which eliminates the offending elements and restores performance to near theoretical values. This transformation and synthesis of the filter utilizes the technique of cascade synthesis adapted to monolithic crystal filters by Dillon and Lind as set forth in a paper entitled "Cascade Synthesis of Polylithic Crystal Filters Containing Double Resonator Monolithic Crystal Filter (MCF) Elements," *IEEE Transactions on Circuits and Systems*, CAS-23, Pages 146–154 (March 1976).

However, these prior art techniques did not allow realization of practical monolithic crystal filter Darlington C-sections.

Figure 1:
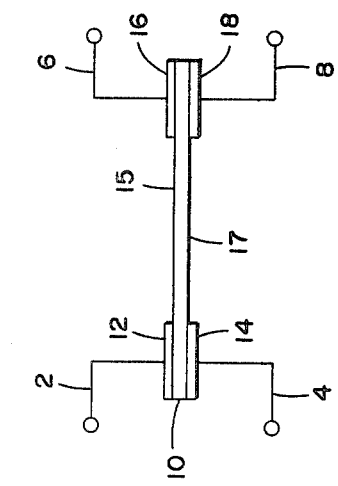
FIG. 1 is a schematic diagram of a double-resonator monolithic crystal filter element or unit.

A representation of a double resonator monolithic crystal filter element is shown in FIG. 1. First and second spaced apart electrodes 12 and 16 are mounted on one face 15 of crystal element 10 while third and fourth spaced electrodes 14 and 18 are mounted on the opposite face 17 of said crystal element 10 in superimposed relationship with the first and second electrodes 12 and 16, respectively. Each of the electrodes 12, 14, 16 and 18 have a corresponding conductor 2, 4, 6 and 8 respectively, connected thereto. Crystal element 10 may be a piezoelectric crystalline substance, a suitable example being quartz.

Electrodes 12, 14, 16 and 18 may be of any suitable type such as gold, rectangular plates which are vapor deposited on a crystal body 10. A suitable example of a crystal body is an AT-cut crystal although other types such as a BT-cut crystal could be used. Using the method disclosed in the patent to Beaver et al, one skilled in the art can adjust the dimensions, mass and spacing of the resonators or electrodes to obtain a crystal element which, when properly coupled with discrete, external reactive elements, provides the desired coupling in accordance with the electrical equivalent circuit shown within dashed lines 24 or 26 in FIG. 13.

FIG. 2 illustrates the ladder equivalent circuit of the monolithic crystal filter element shown in FIG. 1. The two series resonant circuits formed by the inductors L, and capacitors C, represent the electrical equivalents of the resonators formed by the pairs of electrodes 12 and 14 and 16 and 18, respectively, with the crystal element 10 is these resonators were uncoupled and did not interact. The capacitive "T" circuit 20 formed by the cross-arm series capacitors $C_m$ and the upright shunt capacitor $-C_m$ constitutes a coupling network that represents the electrical equivalent of the acoustical coupling and phase shift between the resonator formed of electrodes 12 and 14 and the resonator formed of electrodes 16 and 18. "T" section 20 is the central immittance inverter and may also be represented as a "T" of inductances. Capacitor $C_0$ represents the electrical equivalent of the static or interelectrode capacitance across each resonator due to the finite area of the electrodes. The equivalent electrical circuit of the crystal filter is shown in FIG. 2 and represents a bandpass filter section function.

Figure 3:
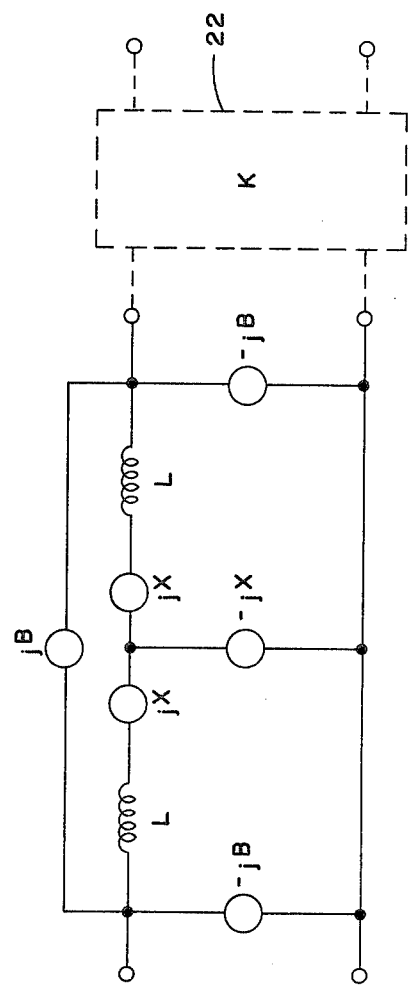
FIG. 3 is a lowpass ladder prototype of the double resonant monolithic crystal filter element shown in FIG. 2.

FIG. 3 is a circuit diagram of a nonphysical lowpass ladder prototype of the double resonant monolithic crystal filter (MCF) device shown in FIG. 2. The circles are frequency invariant reactances and the lowpass MCF section is shunted by a reactive element, $-jX$, which may be inductive or capacitive and which produces a pair of real frequency transmission zeros or resonances. The output of the lowpass MCF section is coupled into constant-K lowpass filter or inverter section 22. The circuit as shown in FIG. 3 provides outstanding theoretical results. However, practical models for applications such as in satellite use are not realizable since computer analysis demonstrates that element Q's for the bridging inductor, jB, and inverter inductor, $-jX$, of the constant-K section, respectively, must be in the order of 200 or greater in order to realize acceptable performance. Due to size and weight constraints, it is impractical to provide inductors of this magnitude. Further, the self-resonance of the inductors is in the order of 8–12 Mhz which is unacceptably low for these applications. Also, a very severe problem with this network is a tilt in the passband of 0.8 db caused by the external inverters and monolithic bridging elements when practical element Q's are used. This is shown by curve A in FIG. 14 and is a result of the resistance associated with the inductor Q causing the operation of the inverter to deviate too far from the ideal and resulting in impedance mismatches within the filter.

The problems associated with these inductors are overcome using a unique transformation to eliminate the offending elements. Basically, the filter is designed by incorporating the external inverters into the monolithic crystal resonator and by changing the bridging inductors to capacitors. The resulting network is devoid of all inductors and unexpectedly and uniquely eliminates all the problems associated with the circuit shown in FIG. 3.

A further benefit of the use of the bridging capacitor in place of the bridging inductor is that it allows incorporation of stray capacitance inherent in the crystal resonator whereas as inductor would simply form a tuned circuit with the stray capacitance which would degrade the desired performance characteristics.

Each monolithic crystal filter section has realized attenuation poles or transmission zeros on the real axis and is a monolithic crystal filter form for the classical Darlington C section. With these sections, a practical nonminimum phase filter, for example, such as the Rhodes filter, is realized.

Synthesis of the network shown in FIG. 3 is by the method of cascade synthesis. This is a zero-removal type of synthesis in which all the elements for a zero producing section are removed from the network input admittance at one time. Rhodes filters are specified by a parameter "A" which relates to bandpass ripple, phase linearity and filter sharpness and, n, the degree of the filter. The transfer function for a Rhodes-type filter of degree 6 and A=1.0 is:

$$S_{12} = \frac{5.120 - 5.127p^2 + 0.599p^4}{5.120 + 25.455p + 58.203p^2 + 80.695p^3 + 74.955p^4 + 44.743p^5 + 17.202p^6}$$

which possesses two pairs of finite transmission zeros at $p=\pm 1.074$, ($p=\sigma+j\omega$ where $\sigma$ represents the real axis and $j\omega$ represents the imaginary axis) and $p=\pm 2.722$ and a further pair at infinity. The transfer function is frequency normalized to exhibit 0.5 db loss at $\omega=1.0$ Rad/S. $S_{11}$ is formed from $S_{12}$ as follows:

$$S_{11}^2 = 1 - S_{12}^2$$

$$= S_{11}(p)S_{11}(-p) = 1 - S_{12}(p)S_{12}(-p)$$

and $$S_{11}(p)S_{11}(-p) = \frac{0.0067 + 0.561p^2 + 14.526p^4 + 117.92p^6 + 399.16p^8 + 576.77p^{10} + 295.91p^{12}}{26.22 - 51.94p^2 + 46.95p^4 + 111.78p^6 + 399.52p^8 + 576.77p^{10} + 295.91p^{12}}$$

from which $$S_{11}(p) = \frac{0.00475 + 0.200p^2 + 0.975p^4 + p^6}{0.298 + 1.480p + 3.383p^2 + 4.691p^3 + 4.357p^4 + 2.601p^5 + p^6}$$

$Y_{11}$, the network input admittance, is now formed from $S_{11}$.

$$Y_{11} = \frac{1 - S_{11}}{1 + S_{11}}$$

and $$Y_{11} = \frac{0.293 + 1.480p + 3.184p^2 + 4.691p^3 + 3.382p^4 + 2.601p^5}{0.302 + 1.480p + 3.583p^2 + 4.691p^3 + 5.332p^4 + 2.601p^5 + 2p^6}$$

Proceeding with the synthesis, the lowpass elements are now extracted. Beginning with the zeros at $p=\pm 2.72179$, they are removed with a Darlington C-Section which has the following transmission matrix:

$$\frac{1}{1 - \left(\frac{p^2}{\sigma_o^2}\right)} \begin{bmatrix} 1 + ap^2 & bp \\ cp & 1 + dp^2 \end{bmatrix}$$

where $$a = \frac{Y(\sigma_o) - \sigma_o Y'(\sigma_o)}{\sigma_o^2 [Y(\sigma_o) + \sigma_o Y'(\sigma_o)]}$$

$$b = \frac{2}{\sigma_o [Y(\sigma_o) - \sigma_o Y'(\sigma_o)]}$$

$$c = \frac{2Y^2(\sigma_o)}{\sigma_o [Y\sigma_o) + \sigma_o Y'(\sigma_o)]}$$

$$d = \frac{Y(\sigma_o) + \sigma_o Y'(\sigma_o)}{\sigma_o^2 [Y(\sigma_o) - \sigma_o Y'(\sigma_o)]}$$

and $Y(\sigma_o)$ is the input admittance evaluated at $\sigma_o$ and $Y'(\sigma_o)$ is the derivative of the input admittances evaluated at $\sigma_o$.

Extracting this section, the a, b, c, d parameters are:

| | |
|---|---|
| a = 1.28094 | b = 0.94421 |
| c = 1.6576 | d = 0.014225 | from which the values for the lowpass MCF section are:

$$L_1 = \frac{-a}{c} = 0.772766$$

$$B_1 = \frac{-c}{(1+\sigma_o^2)a^{\frac{1}{2}}} = -0.139625$$

$$X_1 = \frac{-a^{\frac{1}{2}}}{c} = -0.68278$$

$$K_1 = \frac{1+\sigma_o^2 a}{\sigma_o^2 a^{\frac{1}{2}}} = 0.754737$$

The remaining input admittance, after extraction of this section, is represented by:

$$Y_{22} = \frac{A'\,Y(p) - C'}{D' - B'(p)}$$

where $A' = 1 + ap^2$    $B' = p$ $C' = cp$    $D' = 1 + dp^2$

Continuing, $$Y_{22} = \frac{0.3214 + 1.0736p + 1.3005p^2 + p^3}{0.1937 + 0.7706p + 1.455p^2 + 1.3005p^3 + p^4}$$

which after normalizing to the proper D.C. value is:

$$Y_{22} = \frac{0.3214 + 1.0736p + 1.3005p^2 + p^3}{0.3318 + 1.3202p + 2.4926p^2 + 2.2280p^3 + 1.7131p^4}$$

Extraction of the zeros at $p = \pm 1.0743$ proceeds in a similar manner and yields the following element values:

$L_2 = 1.7876$    $B_2 = -0.19278$
$X_2 = -0.8471$    $K_2 = 1.01197$

The remaining input admittance, again after normalizing, is:

$$Y_{33} = \frac{0.9686 + 0.7448p}{1 + 1.5079p + 1.1595p^2}$$

which contains only the zeros at infinity. These are removed by extraction of a series inductor and shunt capacitor combination. The MCF lowpass elements for this section are then:

$L_3 = L = 1.5568$    $B_3 = 0$
$X_3 = \frac{-L^{\frac{1}{2}}}{C} = -1.4458$    $K_3 = -X_3 = 1.4458$ and the remaining input admittance is:
$Y_{44} = 0.9686$ which is the terminating admittance to the network. The final lowpass network is transformed to the initial bandpass network shown in FIG. 4 after applying the lowpass to bandpass transformation. The frequency and group delay response of this network are shown for infinite Q in FIG. 5.

Figure 4:
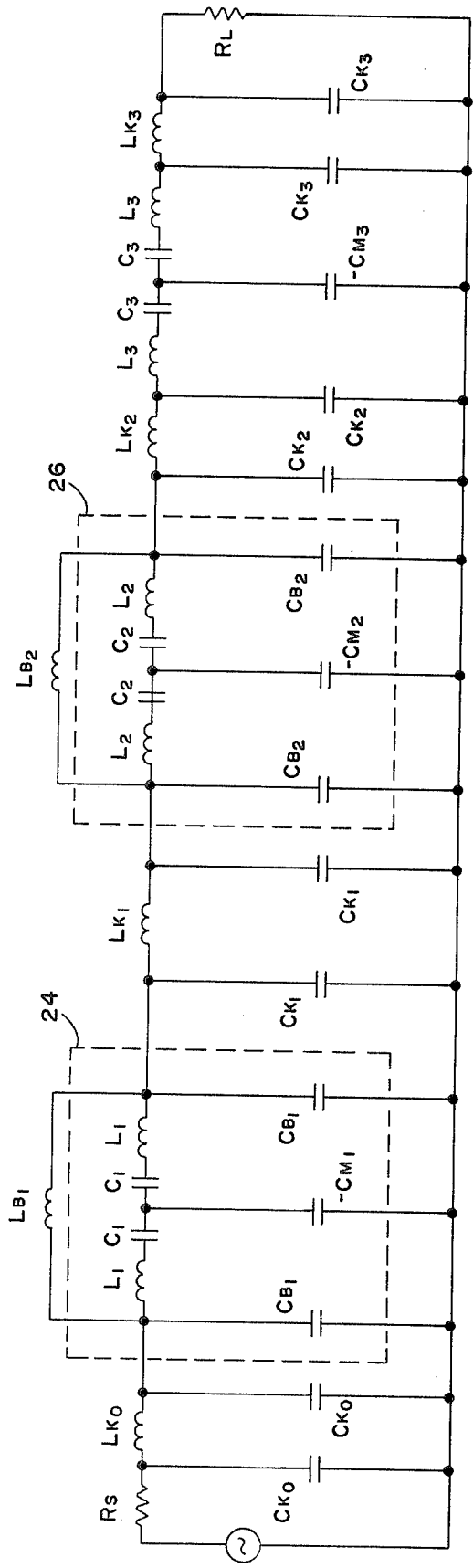
FIG. 4 is a circuit diagram of the resulting Rhodes-type bandpass network after applying the lowpass to bandpass transformation.
Figure 5:
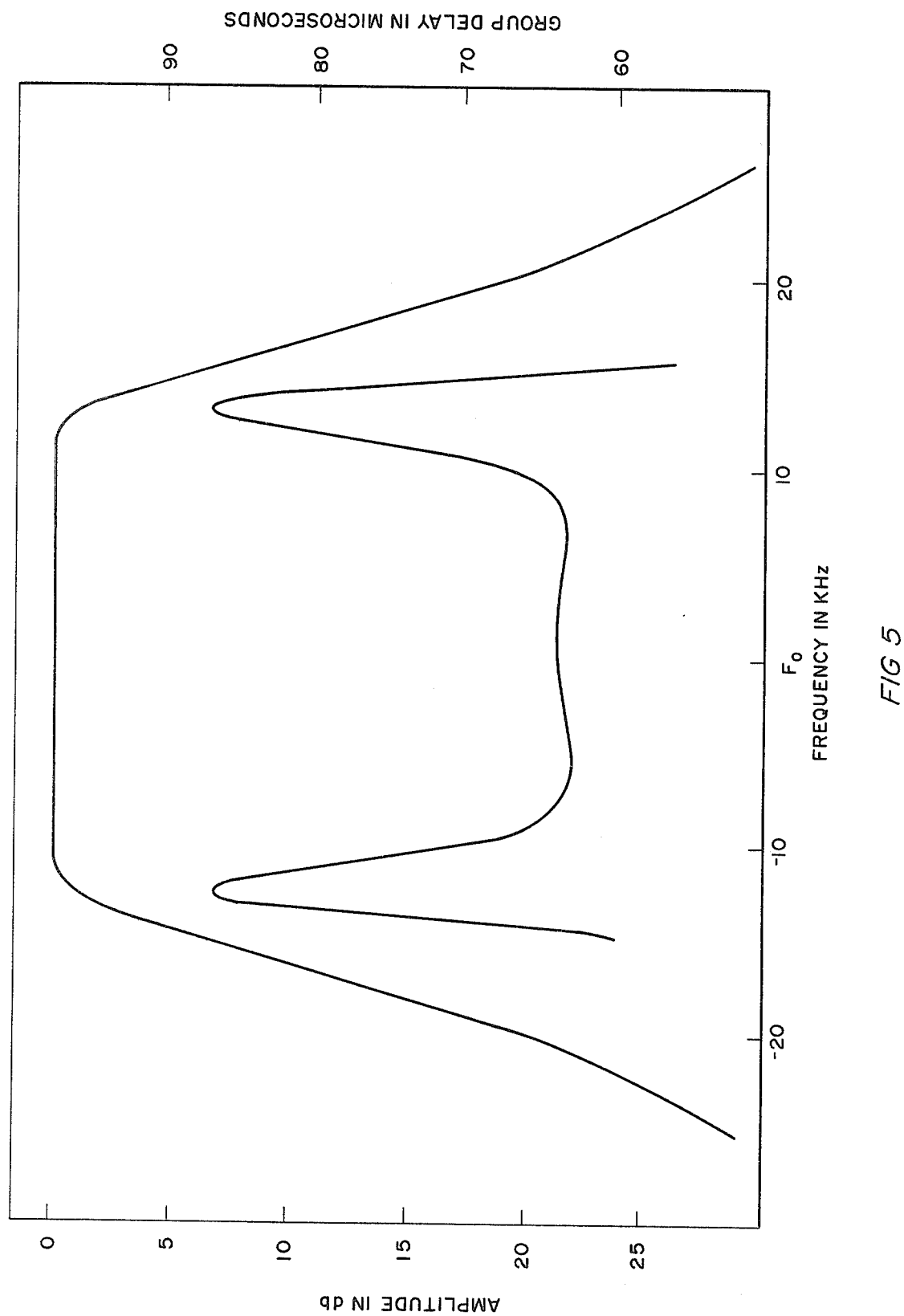
FIG. 5 is a graph of the frequency and group delay response of the network shown in FIG. 4.

Circuit values for the initial network shown in FIG. 4 are listed in Table II.

TABLE II

| $R_S = 500\,\Omega$ $R_L = 516.22\,\Omega$ $f_0 = 23.25$ MHz $BW_{0.5} = 24.5$ KHz | | |
|---|---|---|
| MCF 1 | MCF 2 | MCF 3 |
| $L_1 = 11.70388$ mH | $L_2 = 11.708938$ mH | $L_3 = 11.70333$ mH |

TABLE II-continued

| $C_1 = 4$ mpF | $C_2 = 4$ mpF | $C_3 = 4$ mpF |
|---|---|---|
| $C_{m1} = 4.30017$ pF | $C_{m2} = 8.01411$ pF | $C_{m3} = 4.091396$ pF |
| CIRCUIT VALUES | | |
| $L_{B1} = 114.303456\,\mu$H | $C_{B1} = 0.409954$ pF | |
| $L_{B2} = 35.895318\,\mu$H | $C_{B2} = 1.305438$ pF | |
| $L_{K0} = 7.3908769\,\mu$H | $C_{K0} = 6.340133$ pF | |
| $L_{K1} = 7.921389\,\mu$H | $C_{K1} = 5.91552$ pF | |
| $L_{K2} = 7.48285\,\mu$H | $C_{K2} = 6.2622$ pF | |
| $L_{K3} = 7.52842\,\mu$H | $C_{K3} = 6.22429$ pF | |

Figure 14:
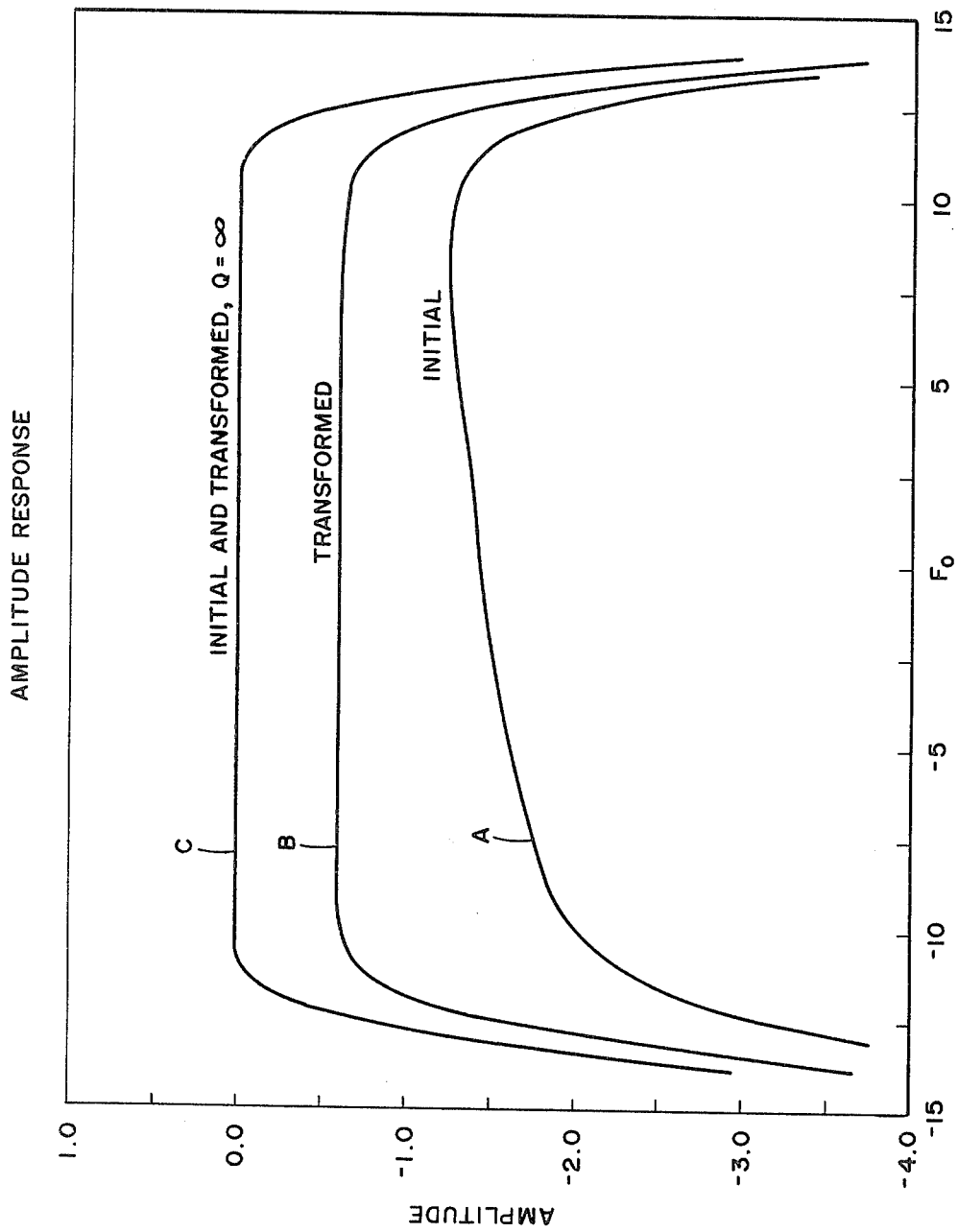
FIG. 14 is a graph showing the amplitude response of the bandpass filter of FIG. 13 for both infinite and finite Q as well as the response of the initial model shown in FIG. 4 with practical Q's for purposes of comparison.

Although this network developed as shown in FIG. 4 has excellent theoretical response, especially group delay response, it has several severe problems associated with it, and is not realizable as a practical network. Foremost among these problems is a tilt in the passband of 0.8 db caused by the inverters and monolithic bridging elements when practical element Q's are used. This is shown in FIG. 14 and is a result of the resistance associated with the inductor Q causing the operation of the inverter to deviate too far from the ideal, resulting in impedance mismatches within the filter. Another major problem is that for this frequency range, the bridging inductor values are too high. Practical components in this frequency range have a self-resonance of 8–12 MHz, which is well below the filter center frequency. To overcome these problems, a transformation is made which results in the immittance inverter elements, $L_K C_K$, being absorbed into the monolithics and the monolithic bridging inductors, $L_B$, converting to capacitors.

The transformation begins with impedance scaling the network so that all external inverters have the same element values.

Impedance scaling is well-known in the art as set forth in the article, "Bandpass Crystal Filter by Transformation of Lowpass Ladder," *IEEE Trans. on Circuit Theory*, CT-15, PP. 492–494, December 1968, by A. C. J. Holt and R. L. Gray. The inverters are then converted to the equivalent capacitive "T" configuration with negative series arm and a positive shunt leg to allow absorption into the monolithic. The monolithic element as shown in FIG. 3 essentially is composed of two inverters in parallel, the pi network of jB elements and the tee network of jX elements. It is possible, by changing the sign of all elements in each of these parallel inverters, to replace the bridging inductor, $L_B$ in FIG. 4, with a capacitor. This has the net effect of changing the phase relationship in each inverter by 180° while maintaining the phase relationship through the filter.

Figure 6:
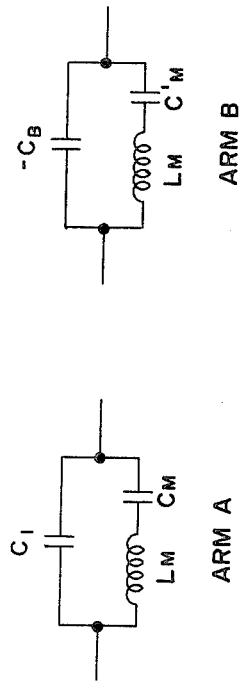
FIG. 6 is a circuit diagram of a lattice conversion of the ladder prototype shown in FIG. 3 or one of the MCF's shown in FIG. 4.

To absorb the inverters into the monolithic, it is necessary to convert the ladder form of the monolithics as shown by MCF 24 in FIG. 4 into the equivalent lattice shown in FIG. 6. The horizontal arm shown in FIG. 6 is designated as arm A and the diagonal arm is designated as arm B hereinafter.

Figure 7:
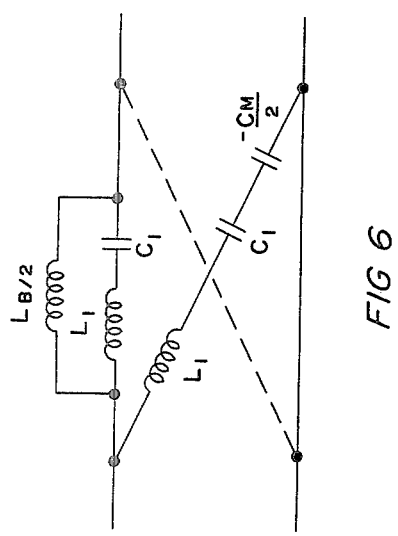
FIGS. 7, 8, 9 and 10 are circuit diagrams illustrating the steps required in transforming the lattice network shown in FIG. 6 to an equivalent circuit with the inverters absorbed in the monolithic.

First, the shunt capacitor $C_B$ is pulled into the lattice and placed in parallel with each arm as shown in FIG. 7. In arm A, as shown in FIG. 7, the upper capacitor $C_1$ now has a value represented by the following equation:

$$C_1 = 2C_B - C_B$$

In arm B, the capacitor $C_m'$ has the following value:

$$C_m' = \frac{-C_m(C_m/2)}{C_m - C_m/2}$$

Figure 8:
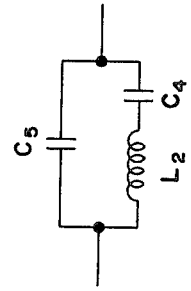

Next, the capacitance which represents the capacitance of the constant K element is placed in series with each arm and the parallel element arrangement is converted to a series parallel arrangement as shown in FIG. 8 for arm B. In FIG. 8, the elements have the following values:

$$L_1 = L_m \left[ \frac{C_m'}{C_m' - C_B} \right]^2,$$

$$C_2 = \frac{C_m' C_B}{C_m' - C_B} \quad \text{and}$$

$$C_3 = C_m' C_B$$

Figure 9:
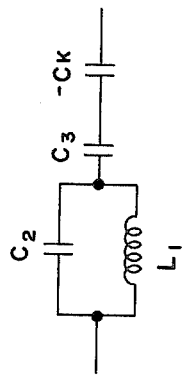

The capacitor $-C_K$ as shown in FIG. 8 is then combined in the usual manner with capacitor $C_3$ and the network is then converted back to the parallel form shown in FIG. 9. In FIG. 9 the elements have the following values:

$$L_2 = L_1 \left[ \frac{C_2 + C_3'}{C_3'} \right]^2$$

where $$C_3' = \frac{-C_3 C_K}{C_3 - C_K},$$

$$C_4 = \frac{(C_3')^2}{C_3' + C_2} \quad \text{and}$$

$$C_5 = \frac{C_2 C_3'}{C_2 + C_3'}$$

For the exemplary values given, $L_2 = 11.7038$ mH, $C_4 = 4$ mpF and $C_5 = -0.4099$ pF.

The same procedure is then followed with respect to arm A shown in FIG. 7.

Figure 10:
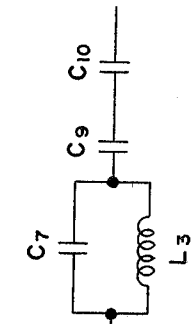
Figure 10:
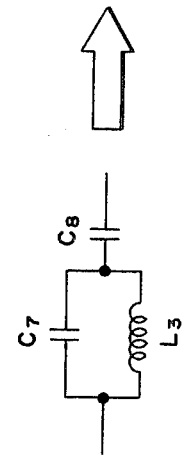
Figure 10:
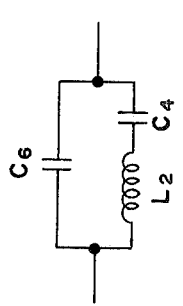

At this point, sufficient capacitance, $C_O$, to make $C_5$ in FIG. 9 a positive value is brought into both arms from the remaining shunt capacitance $C_K$ of the inverter. Arm B is then converted to a series parallel arrangement once again with the series arm divided into two capacitors as shown in FIG. 10. In FIG. 10, the circuit elements have the following values:

$$C_6 = C_5 + C_O$$

$$C_9 = \frac{L_3 C_7 - C_7 \sqrt{L_3 L_m}}{L_3 - L_m}$$

and $$C_{10} = \frac{C_8 C_9}{C_9 - C_8}$$

Figure 11:
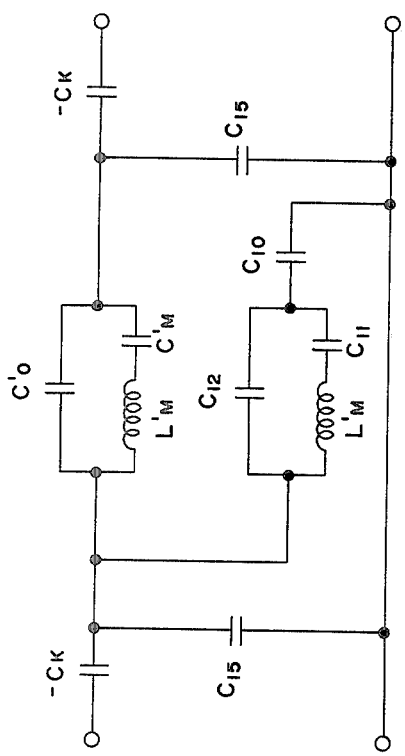
FIG. 11 is a diagram of the transformed lattice shown in FIG. 6 which is formed to enable derivation of a bridged-T network.

The value of $C_7$ and $C_8$ are determined by standard transformations old and well-known in the art. $C_9$ is selected such that when $L_3$, $C_7$ and $C_9$ are converted back to the parallel configuration, the resulting motional L value will be equal to the "A" arm value resulting in the monolithic network as shown in FIG. 11.

It is possible to place capacitor $C_{10}$ in series with the monolithic lattice by a transformation described by Weinberg in a text entitled "Network Analysis and Synthesis," *McGraw-Hill Book Company*, Pages 87–88, (1962). That transformation requires an ideal transformer to keep from short circuiting one of the series arms of the lattice. However, by converting the remaining lattice to the equivalent unbalanced form, the transformer may be removed. Proceeding, a capacitance equal to $C_{12}$ in FIG. 11 is first removed from both arms to provide the necessary capacitance for the monolithic. The lattice is then unbalanced to the equivalent bridged "T".

Figure 12:
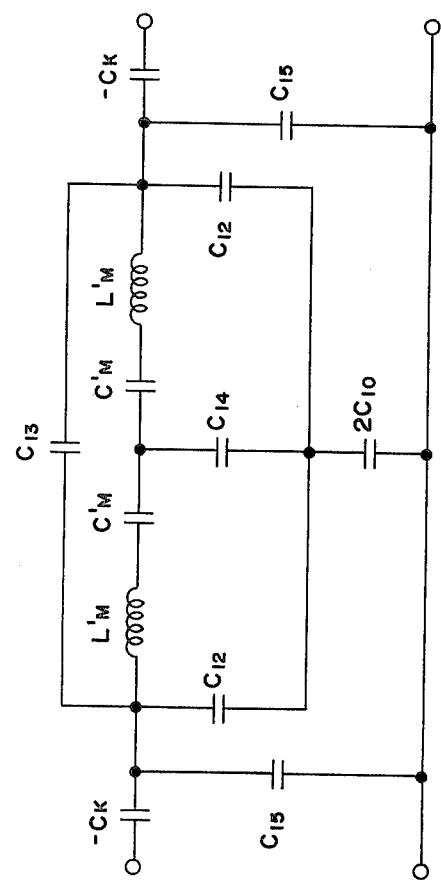
FIG. 12 is the equivalent bridged-T circuit following or after absorption of the capacitive inverters into the monolithic.

The resulting network is shown in FIG. 12 wherein:

$$C_{13} = \frac{C_0' - C_{12}}{2},$$

$$C_{14} = \frac{C_m' C_{11}}{C_m' - C_{11}} \quad \text{and}$$

$$C_{15} = C_K - C_{12}$$

The values of $C_{11}$ and $C_{12}$ are also determined by standard transformations old and well-known in the art. After all inverters have been absorbed and the monolithic has been impedance scaled for reasonable motional L and C values, a plurality of the monolithics may be coupled to provide a final transformed polylithic bandpass filter as shown in FIG. 13.

Figure 13:
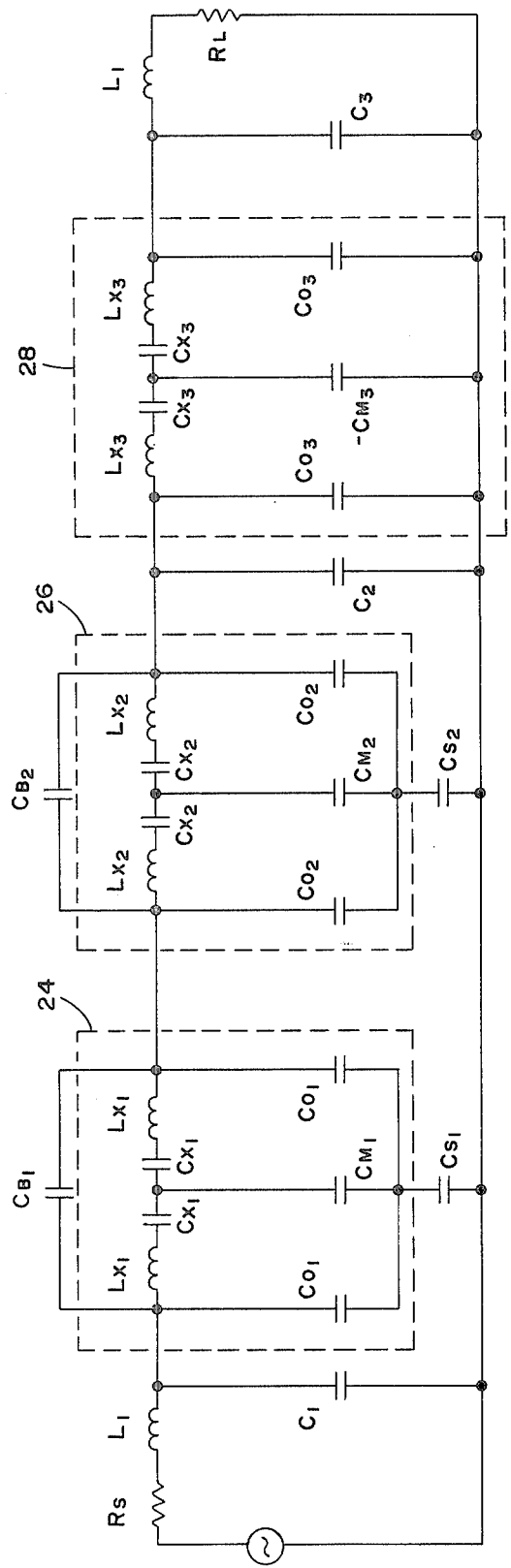
FIG. 13 is a circuit diagram of the final transformed polylithic crystal bandpass filter network.

Circuit values for the transformed bandpass filter in FIG. 13 are given in Table III.

TABLE III

| $R_S = 750 \,\Omega$ | $R_L = 665.9511 \,\Omega$ | $f_0 = 23.25$ MHz | $BW_{0.5} = 24.5$ KHz |
|---|---|---|---|
| MCF 1 | MCF 2 | MCF 3 | |
| $L_{X1} = 9.92357$ mH | $L_{X2} = 9.9547$ mH | $L_{X3} = 13.115288$ mH | |
| $C_{X1} = 4.730379$ mpF | $C_{X2} = 4.71316$ mpF | $C_{X3} = 3.571833$ mpF | |
| $C_{01} = 1.51988$ pF | $C_{02} = 3.93638$ pF | $C_{03} = 0.803662$ pF | |
| $C_{M1} = 6.1748$ pF | $C_{M2} = 11.08737$ pF | $C_{M3} = 3.6509269$ pF | |
| $C_{S1} = 17.6725$ pF | $C_{S2} = 16.446919$ pF | | |

CIRCUIT COMPONENT VALUES

| $L_1 = 9.051939 \,\mu$H | $C_{B1} = 0.30101$ pF | $C_1 = 3.5$ pF |
| | $C_{B2} = 0.4012987$ pF | $C_2 = 0.873034$ pF |
| | | $C_3 = 5.1766966$ pF |

As can be seen in FIG. 13, no coupling capacitor exists between monolithics 24 and 26. For the particular given center frequency, $f_0$, and the bandpass requirements of the network shown in FIG. 13, the value of the capacitor is reduced to zero and, thus, it is not shown. In general, however, a shunt capacitor of proper value determined by well-known design techniques will be used to couple MCF 24 to MCF 26 to negate any stray capacitance.

Figure 15:
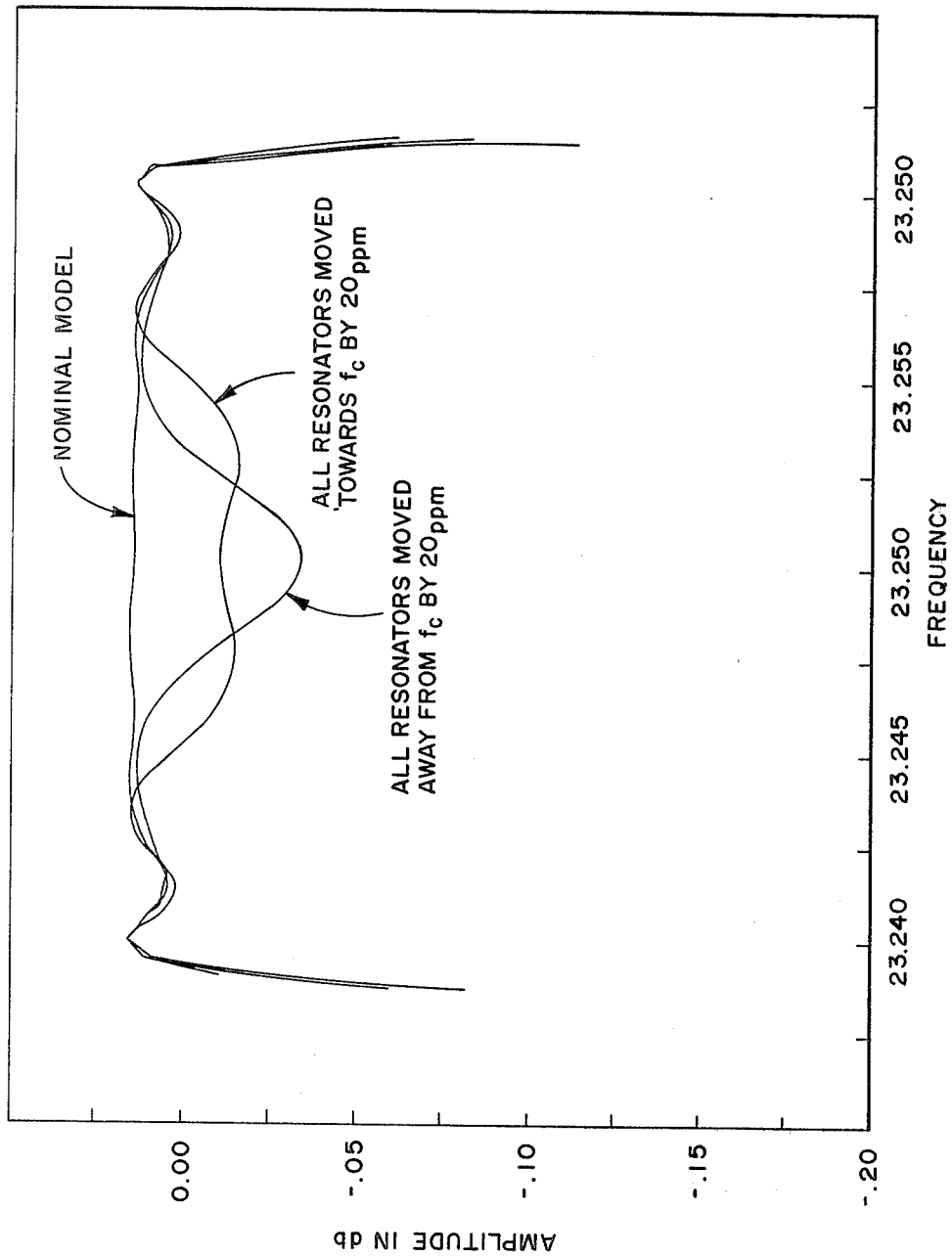
FIG. 15 is a graph showing the change in bandpass ripple for a motional L and C change of ±20 ppm.

The amplitude response of the filter in FIG. 13 with both infinite Q, curve C, and finite Q, curve B, is shown in FIG. 14. Finite Q values are 70,000 for the resonators and 2,000 for all capacitors in the network and 50 for the input and output impedance matching inductors, $L_1$. Also shown, for comparison purposes, is curve A which, as stated earlier, is the response of the initial model shown in FIG. 4 with practical Q's. As can be seen from the figures and the data, summarized in Table III, except for the slight rounding of the corners and the insertion loss, the response of the transformed model, curve B, is almost identical to the theoretical model, curve C. Computer analysis has also shown the model to be relatively insensitive to components and crystal frequency tolerances. FIG. 15 shows that for a change of motional L and C in the order of plus or minus 20 ppm, the passband ripple only increases by approximately 0.04 db. Furthermore, since the transformation is exact, it follows none of the usual narrow band approximations and the inherent inaccuracies that go with them.

The parameters of the filter obtained as a result of the transformation as compared with the theoretical model having infinite Q and the initial model having a practical Q is shown in Table IV.

TABLE IV
SUMMARY OF RESULTS

| PARAMETERS | INITIAL MODEL & TRANSFORMED MODEL INFINITE Q | INITIAL MODEL PRACTICAL Q | TRANSFORMED MODEL PRACTICAL Q |
|---|---|---|---|
| 0.5 db BW | 24.460 KHz | 18.909 KHz | 23.917 KHz |
| 10 db | 32.503 KHz | 32.735 KHz | 32.675 KHz |
| 30 db BW | 52.287 KHz | 53.106 KHz | 53.082 KHz |
| Ripple ± 10 KHz | 0.011 db | 0.786 db | 0.069 db |
| Phase Linearity | ±0.650° | ±0.618° | ±0.630° |
| Insertion Loss | 0.0 db | 1.235 db | 0.577 db |

Figure 16:
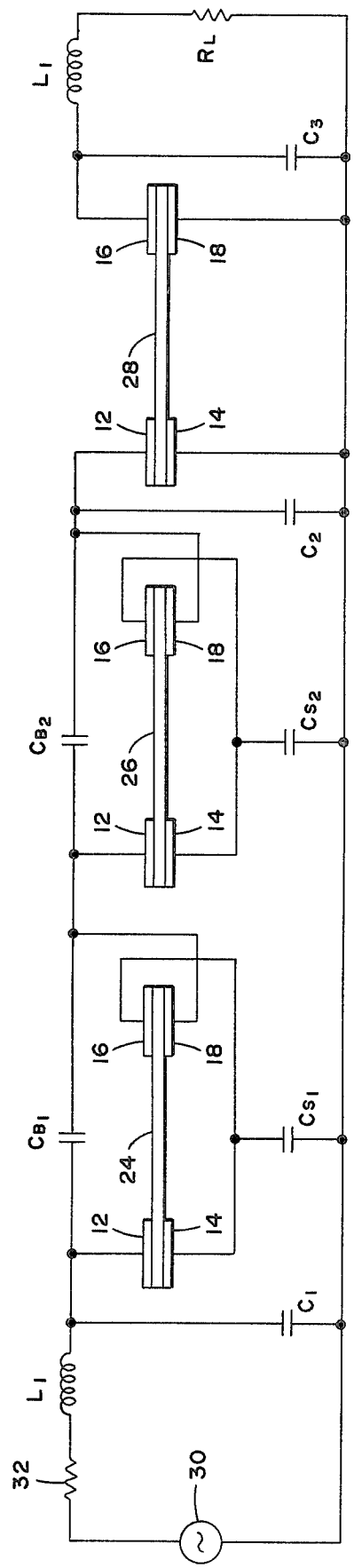
FIG. 16 is a diagram of the physical implementation of the MCF elements to form the circuit of FIG. 13.

FIG. 16 is a diagram of the physical interconnection between each monolithic crystal filter element that is necessary in order to provide the novel bandpass filter as disclosed herein in FIG. 13. The filter network disclosed in FIG. 16 is only a representative embodiment of the present invention and other configurations utilizing the same design techniques are possible. In FIG. 16, the monolithic elements are 24, 26 and 28, each having electrodes 12, 14, 16 and 18 attached thereto. Monolithics 24 and 26 each have a respective bridging capacitor $C_{B1}$ and $C_{B2}$ electrically connected between electrodes 12 and 18 wherein $C_{B1} = C_{13}$ in FIG. 12. They also have a respective shunt capacitor $C_{S1}$ and $C_{S2}$ electrically connected between the reference potential of the filter and an interconnection between the electrodes 14 and 16 where $C_{S1} = 2C_{10}$ in FIG. 12. An energy source 30 provides an input to the network through its own internal resistance 32, matching impedance input inductance $L_1$ and input capacitance $C_1$. The output of the second monolithic crystal filter element 26 is coupled through shunting capacitor $C_2$ to the third MCF 28. The output of MCF 28 is coupled through shunting capacitor $C_3$ to the matching impedance output inductor $L_1$ and the load resistance $R_L$.

Capacitors $C_1$, $C_2$ and $C_3$ actually incorporate the stray capacitance inherent at the input and output of each resonator. Thus, for example, capacitor $C_1$ in FIG. 16 incorporates input internal stray capacitance $C_{B1}$ and immediate parallel external shunt capacitor $C_{K1}$. In like manner, the other shunt capacitors $C_2$ and $C_3$ in FIG. 16, as well as the shunt capacitor between MCF 24 and 26 which is not shown because in this particular case it is equal to zero, incorporate corresponding stray and external shunt capacitors shown in FIG. 4.

The negative capacitors, $-C_K$, shown at the input and output in FIG. 12 are replaced at the proper location by inductors, $L_1$, in FIGS. 13 and 16. These inductors, however, do not degrade the performance of the filter as the resistance associated with their Q is absorbed into the source and load.

Thus, there has been disclosed a novel and unique bandpass filter using a unique transformation to unexpectedly eliminate the problems associated with bridging and inverter inductors such as found in theoretical Rhodes-type filters. In the unique transformed circuit, the external inverters are incorporated into the monolithic crystal resonator and the bridging inductors are changed to capacitors unexpectedly and advantageously making the filter of this invention especially useful in applications requiring very precise bandpass filters such as in satellite communications and similar applications in a significantly more practical manner with less power consumption than possible with prior art devices. Present satellite systems contain from 30 to 60 channels containing several high performance filters per channel which require considerable design time and stringent production controls. The unique filter disclosed herein is simple in design and significantly reduces the need for the stringent production controls. Other advantages and technical achievements of this invention over the prior art techniques obtained as a result of the present novel and unique invention include:

a. simplified circuitry;
b. lower cost of both components and production;
c. weight and size reduction;
d. simplification of construction, manufacture, and packaging; and
e. elimination of the need for delay equalizers;

which advantages and technical achievements are particularly permitted by the elimination of the inductors. Such novel features and advantages are particularly useful in space communication applications where solar power is used, available space (volume) is at a premium, and weight and size reductions are especially significant.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

What is claimed is:

1. A two-pole inductorless monolithic crystal filter element comprising:
    a. first and second spaced electrodes deposited on one face of said element,
    b. third and fourth spaced electrodes deposited on the opposite face of said element in superimposed relationship with said first and second electrodes,
    c. a first capacitor coupled between said first and fourth electrodes,
    d. means electrically coupling said second and third electrodes, and
    e. a second capacitor coupling said second and third electrodes to a point of reference potential, said first electrode and point of reference potential being designated as input terminals, and said fourth electrode and point of reference potential being designated as output terminals.

2. A filter element as in claim 1 further including:
a. real and imaginary mathematical axes, and
b. one pair of realized transmission zeros on the real axis.

3. A filter element as in claim 2 further including classical Darlington C-section transfer characteristics.

4. An improved method of constructing an inductorless two-pole monolithic crystal filter element using a piezoelectric crystal element having first and second spaced apart electrodes deposited on one face of said element and third and fourth spaced apart electrodes deposited on the opposite face of said element and having stray capacitance inherent therein, the improvement comprising the steps of:
a. bridging the first and fourth electrodes with a capacitance, and
b. coupling the second and third electrodes to a reference potential with a common capacitor whereby an input may be applied between said first electrode and said reference potential and a load coupled between said fourth electrode and said reference potential.

5. A method as in claim 4 wherein said bridging capacitance allows incorporation of stray capacitance inherent in said crystal element.

6. In a method of constructing a polylithic bandpass filter containing transmission zeros utilizing series coupled monolithic filter elements each having a bridging inductor for realizing the transmission zeros and both internal and external inductor-capacitor elements forming immittance inverters, the improvement comprising the steps of:
a. changing the sign of all inductor-capacitor elements of the internal immittance inverters associated with each monolithic,
b. absorbing the external immitance inverters into the monolithic, and
c. replacing the bridging inductor for each monolithic with a capacitor whereby an inductorless bandpass filter is obtained.

7. A polylithic crystal bandpass filter section having transmission zeros comprising:
a. first and second monolithic crystal filter elements each having first and second spaced electrodes deposited on one face thereof, third and fourth spaced electrodes deposited on the opposite face of said element, a bridging capacitor coupled between said first and fourth electrodes, and a shunt capacitor coupling said second and third electrodes to a reference potential,
b. means coupling said fourth electrode of said first element to said first electrode of said second element whereby the output of said first element is coupled as an input to said second element,
c. a third monolithic crystal filter element having first and second spaced electrodes deposited on one face thereof and third and fourth spaced electrodes deposited on the opposite face thereof,
d. means electrically connecting said fourth electrode of said second element to said first electrode of said third element whereby the output of said second element is coupled as an input to said third element, and e. means electrically connecting said third and fourth electrodes of said third element to a reference potential whereby a load may be electrically connected between said second terminal of said third element and a reference potential and a bandpass filter is obtained.

8. A bandpass filter as in claim 7 further including a shunt capacitor coupled between said fourth electrode of said second monolithic crystal filter element and reference potential.

9. A bandpass filter as in claim 7 further including a shunt capacitor coupled between said second electrode of said third monolithic crystal filter element and reference potential.

10. A bandpass filter as in claim 7 further including a classical Darlington C-section extracted for each said first and second monolithic crystal filter during synthesis whereby a nonminimum phase filter is obtained.

11. A bandpass filter as in claim 7 wherein said crystal filter elements are quartz crystals.

12. A bandpass filter as in claim 11 wherein each of said quartz crystals is an AT-cut crystal.

13. A bandpass filter as in claim 12 wherein said electrodes are gold plates vapor deposited on said crystal body.

14. A bandpass filter as in claim 13 wherein said first and third electrodes and said second and fourth electrodes each form a pair of electrodes in superimposed relationship respectively on opposite faces of said crystal.

15. A bandpass filter as in claim 14 further including:
a. real and imaginary mathematical axes, and
b. one pair of realized transmission zeros on the real axis.

16. A bandpass filter as in claim 7 further including shunt capacitors on the input and output of each filter element which incorporate any inherent input and output stray capacitance therein.

17. A method of deriving construction parameters for a polylithic inductorless bandpass filter containing transmission zeros, operable about a preselected center frequency, and which utilizes a plurality of series connected monolithic crystal filter elements, comprising the steps of:
defining each monolithic crystal filter element as an equivalent ladder-form lowpass filter network containing immittance inverters corresponding to internal characteristics of each monolithic crystal and to external immittance matching networks associated with each monolithic crystal filter element;
synthesizing an equivalent ladder-form bandpass filter network from said lowpass network, said bandpass network containing internal and external immittance inverter networks corresponding to said internal and external immittance inverters of said lowpass filter network and incorporating a bridging inductor for providing transmission zeros;
impedance scaling said synthesized bandpass filter network so that all external immittance inverters have substantially the same element values;
converting said synthesized bandpass filter network to an equivalent lattice network for absorbing said external immittance inverters into the associated monolithic crystal filter equivalent network; and
transforming said lattice network into an equivalent bridged-T network wherein said bridging inductor is replaced with a capacitor and the sign of all elements in each internal immittance inverter is changed thereby defining the parameters for each monolithic crystal filter element which will permit series interconnection therebetween to construct the polylithic inductorless bandpass filter.

18. A method as in claim 17 wherein said step of transforming said equivalent ladder-form network to an equivalent lattice network further includes the step of changing each external immittance inverter to an equivalent capacitive T configuration with negative series arms and a positive shunt leg whereby each said inverter may be absorbed into said monolithic.

19. A method as in claim 17 further including the step of determining inductor and capacitor values necessary for the polylithic inductorless bandpass filter to operate symmetrically about the preselected center frequency.

* * * * *